United States Patent [19]

Nishizawa et al.

[11] Patent Number: 4,834,831
[45] Date of Patent: May 30, 1989

[54] METHOD FOR GROWING SINGLE CRYSTAL THIN FILMS OF ELEMENT SEMICONDUCTOR

[75] Inventors: Junichi Nishizawa, Sendai; Kenji Aoki, Matsudo, both of Japan

[73] Assignees: Research Development Corporation of Japan, Tokyo; Junichi Nishizawa, Sendai; Seiko Instruments, Inc., Tokyo, all of Japan

[21] Appl. No.: 93,505

[22] Filed: Sep. 4, 1987

[30] Foreign Application Priority Data

Sep. 8, 1986 [JP] Japan ................... 61-209575

[51] Int. Cl.⁴ .................. C30B 25/10; C30B 25/14
[52] U.S. Cl. .................... 156/611; 156/610; 156/613; 156/614; 156/DIG. 64; 156/DIG. 102; 156/DIG. 103
[58] Field of Search ............ 156/610, 611, 613, 614, 156/DIG. 64, DIG. 102, DIG. 103

[56] References Cited

U.S. PATENT DOCUMENTS

| | | | |
|---|---|---|---|
| 3,945,864 | 3/1976 | Goldsmith et al. | 156/613 |
| 3,961,997 | 6/1976 | Chu | 156/614 |
| 4,013,502 | 3/1977 | Staples | 156/DIG. 103 |
| 4,179,312 | 12/1979 | Keller et al. | 156/DIG. 103 |
| 4,346,513 | 8/1982 | Nishizawa et al. | 156/613 |
| 4,392,453 | 7/1983 | Luscher | 156/DIG. 103 |
| 4,522,662 | 6/1985 | Bradbury | 156/610 |
| 4,637,127 | 1/1987 | Kurogi et al. | 156/613 |

FOREIGN PATENT DOCUMENTS

| | | | |
|---|---|---|---|
| 3107260 | 9/1982 | Fed. Rep. of Germany | 156/610 |
| 58-209116 | 12/1983 | Japan | 156/613 |

OTHER PUBLICATIONS

Booker et al., Initial Nucleation and Growth of Epitaxial Silicon Layers, Conference of Growth of Crystals, Moscow, U.S.S.R., 7/20-21/66, pp. 108-115.
Matthews, Epitaxial Growth Part A, Academic Press, New York, 1975, pp. 100 to 101.
Runyan, Silicon Semiconductor Technology, McGraw-Hill Books, New York, 1965, pp. 12 and 13.

Primary Examiner—Robert L. Stoll
Assistant Examiner—Robert M. Kunemund
Attorney, Agent, or Firm—Flynn, Thiel, Boutell & Tanis

[57] ABSTRACT

A method for growing a single crystal thin film of an element semiconductor which comprises repeating the successive operations of feeding a single kind of gas containing the element semiconductor as a component element onto a substrate heated in a growth chamber and then exhausting the gas in the growth chamber under controlled conditions and thereby growing the single crystal thin film of said element semiconductor in a desired thickness with a precision of monomolecular layer. In an alternate method for growing a single crystal thin film of an element semiconductor, the sole gas containing the element semiconductor is continuously fed onto the substrate for a given period of time, thereby forming a single crystal thin film of element semiconductor having a desired thickness. According to the present invention, there can be obtained single crystal thin films with high quality in a high reproducibility, by simplified operating parameters and growing apparatus.

2 Claims, 5 Drawing Sheets

METHOD FOR GROWING SINGLE CRYSTAL THIN FILMS OF ELEMENT SEMICONDUCTOR

BACKGROUND OF THE INVENTION

1. Field of the Invention

The present invention relates to a method for growing a single crystal thin film of an element semiconductor and more specifically to a method suitable for growing a high-quality single crystal thin film of an element semiconductor with the precision of a monomolecular layer.

2. Description of Prior Art

As epitaxy techniques for the formation of an epitaxially grown single crystal layer of an element semiconductor consisting solely of one element such as silicon, there have been heretofore known, for example, chemical vapor deposition hereinafter referred to as "CVD"), molecular beam epitaxy (hereinafter referred to as "MBE"), etc. Further, recently, one of the Inventors (Junichi NISHIZAWA) proposed a molecular layer epitaxy method (hereinafter abbreviated as "MLE") which made possible the formation of a grown single crystal layer with the precision a monomolecular layer by alternately introducing different kinds of gases. (Japanese Patent Application No. 59-153978 which has been laid open to public inspection as Laid-Open No. 61-34928.)

However, the above-mentioned known methods have not been completely satisfactory because of the disadvantages set forth below.

For example, in CVD, a source gas (e.g., $SiH_4$) is introduced simultaneously with a carrier gas (e.g., hydrogen) into a reaction chamber and then single crystals are grown by pyrolysis. In a such manner, contamination by impurities is apt to occur due to the introduction of the carrier gas, thereby causing not only deterioration of the quality of a grown layer, but also other problems, for example, difficulties in controlling with the precision of a monomolecular layer.

On the other hand, in the case of MBE in which crystal growth is carried out under ultrahigh vacuum, it is difficult to maintain the rate of crystal growth constant over a long time. Further, MBE is still inferior in the quality of the resulting crystals as compared to CVD set forth above.

MLE has been developed with the object of overcoming the disadvantages of these former methods, but this method is disadvantageous in that the gas feeding system is complicated, since different gases are repeatedly alternately fed. Therefore, improvement has been awaited.

SUMMARY OF THE INVENTION

The present invention has been developed with a view of eliminating the disadvantages associated with the above prior art. More specifically, the present invention is directed to a further improvement in the above MLE.

It is accordingly an object of the present invention to provide a novel method for growing a single crystal thin film of an element semiconductor with the precision of a monomolecular layer on a substrate by introducing only one kind of gas.

As described above, in MLE, different kinds of gases are alternately introduced onto a substrate so that single crystals of an element semiconductor are grown with the precision of a monomolecular layer. In contrast to such a prior art method, the present Inventors discovered a method for growing a single crystal thin film of an element semiconductor wherein the successive operations of feeding a single kind of gas containing the element semiconductor as a component element onto a substrate heated in a growth chamber over a given period of time and exhausting the gas in the growth chamber for a given period of time are repeated under controlled operating conditions and thereby the single crystal thin film of the element semiconductor is grown to a desired thickness with the precision of a monomolecular layer.

In another feature of the present invention, a single kind of gas containing an element semiconductor as a component element is continuously fed onto a substrate heated in a growth chamber under controlled operating conditions over a given period of time, thereby growing a single crystal thin film of the element semiconductor in a desired thickness.

DETAILED DESCRIPTION OF THE PREFERRED EMBODIMENTS

As the result of the Inventors' detailed studies, the operating conditions set forth above are practically controlled in such a manner that the pressure inside the growth chamber, the gas feeding time and exhausting time are in the ranges of $10^{-4}$ to $10^2$ Pa (pascal), 1 to 60 seconds and 1 to 120 seconds, respectively, and other conditions such as the heating temperature of the substrate and the flow rate of the gas fed are appropriately adjusted.

In practicing the first feature of the present invention wherein gas feeding and exhausting operations are alternately repeated, the operating cycle of feeding a single gas containing an element semiconductor as a component element onto a substrate for a predetermined period of time and then exhausting the gas for a predetermined period of time is repeated until a single crystal thin film having a desired thickness is formed. The operating conditions are appropriately adjusted depending on the intended single crystal thin film and they are not necessarily required to be the same throughout all of the cycles.

As the gas containing an element semiconductor as a component element, $SiH_2Cl_2$, $SiHCl_3$, $SiCl_4$, $SiH_4$ or $Si_2H_6$ is preferably used in the present invention.

The present invention will hereinafter be described more specifically with reference to the following examples.

EXAMPLES

Figure 1:
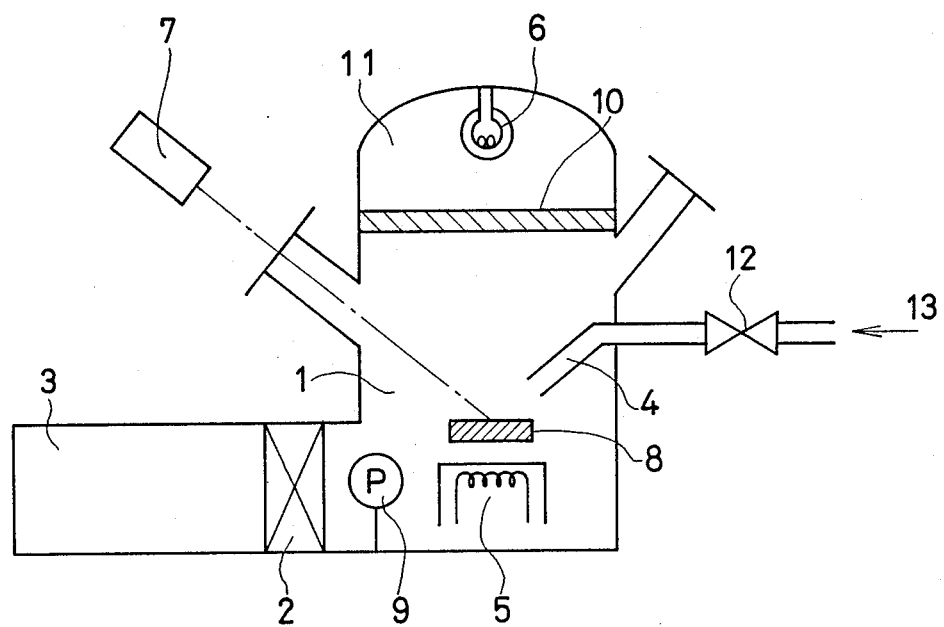
FIG. 1 is a schematic diagram illustrating the construction of the crystal growing apparatus used for carrying out the present invention.

FIG. 1 is a schematic diagram illustrating the construction of a crystal growing apparatus used for growing a single crystal thin film of an element semiconductor in accordance to the present invention. In FIG. 1, reference numerals 1 and 2 designate a growth chamber made of a metallic material, such as stainless steel, and a gate valve, respectively. Numeral 3 indicates an exhaust for evacuating the growth chamber 1 to an ultrahigh vacuum and numeral 4 indicates a nozzle for introducing gas 13 containing a semiconductor component element. Numeral 5 indicates a heater for heating a substrate 8 of (100) oriented silicon semiconductor crystal. The heater 5 is made of a tungsten wire sealed within quartz and an infrared lamp 6 is disposed on the upper portion of a lamp house 11 in order to heat the substrate 8. A quartz plate 10 divides the lamp house 11 from the growth chamber 1. Leads, etc., are not shown in FIG. 1. There are also shown a pyrometer 7 for measuring temperatures and a B-A (Bayard-Alpert) gauge 9 for measuring the degree of vacuum inside the growth chamber 1.

As a practical example of growing single crystals of IV-Group element semiconductor using such an apparatus, particularly silicon will hereinafter be explained.

Figure 2:
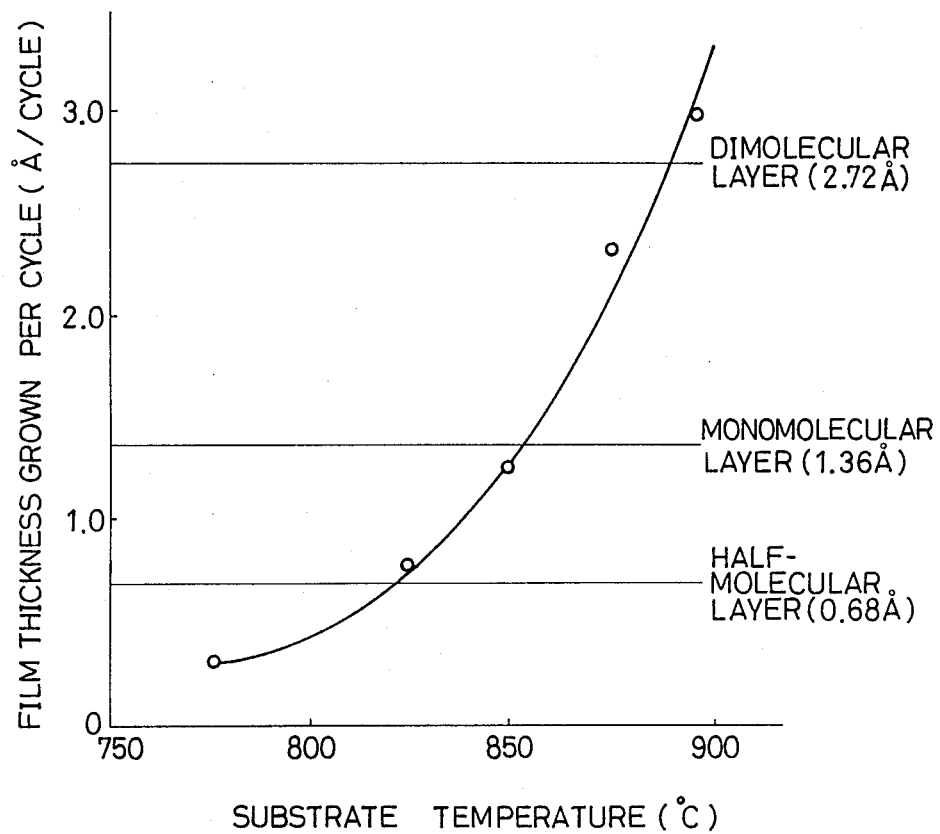
FIG. 2 is a graph showing the substrate temperature dependence of the film thickness grown per cycle of gas feeding and exhausting.

Silicon single crystal thin films were formed using $SiH_2Cl_2$ (dichlorosilane) as a silicon-containing gas at various substrate temperatures while keeping the gas feeding pressure constant. FIG. 2 shows the substrate temperature dependence of the thickness of silicon single crystal thin films grown per cycle at various substrate temperatures. Each of the thin films was grown by repeating a cycle of feeding the dichlorosilane gas into the growth chamber 1 and evacuating the growth chamber 1. In each cycle, gas feeding time and exhausting time were 40 seconds and 20 seconds, respectively. That is, the total time required for one cycle was 60 seconds. The gas feeding pressure was $1.3 \times 10^{-2}$ pascal (Pa). The thickness of the thin film grown per cycle varies on the order of one monomolecular layer to several monomolecules depending on the temperature for the substrate, as shown in FIG. 2. Particularly, the operating conditions for growing thin films on the order of monomolecular layer, dimolecular layer and half-molecular layer per cycle are respectively described hereinafter.

Firstly, in order to grow a monomolecular layer of Si single crystal per cycle, the gate valve 2 was opened and the interior of the growth chamber 1 was evacuated to a pressure of the order of $10^{-7}$ to $10^{-8}$ Pa by using the ultrahigh vacuum exhaust 3. The substrate 8 was heated to a temperature of 800° C. by the heater 5 or the infrared lamp 6 and its surface was subjected to a heat cleaning for five minutes. Then, the substrate 8 was heated to 855° C. by the heater 5 or the infrared lamp 6 and valve 12 was opened to introduce $SiH_2Cl_2$ gas into the growth chamber 1 over 40 seconds while the interior pressure of the growth chamber 1 was maintained at $1.3 \times 10^{-2}$ Pa. Thereafter, the valve 12 was closed and the gas inside the growth chamber 1 was exhausted for 20 seconds. Such an operating cycle grew a monomolecular layer of Si single crystal on the substrate 8. By repeating such a cycle under the same conditions, monomolecular layers were successively grown one after another and thereby a thin film having the desired thickness could be grown with the precision of monomolecular layer. For example, when the above-mentioned cycle was repeated 500 times, a grown thin film approximately 680 Å in thickness was formed on the (100) substrate 8.

Similarly, in order to grow a dimolecular layer of silicon single crystal per cycle, the growth chamber 1 was evacuated to ultrahigh vacuum and the surface of the substrate 8 was subjected to a heat cleaning. After heating the substrate 8 to 890° C., the valve 12 was opened to introduce $SiH_2Cl_2$ gas into the growth chamber 1 for 40 seconds while maintaining the interior pressure of the growth chamber 1 at $1.3 \times 10^{-2}$ Pa. Thereafter, the valve 12 was closed and the gas inside the growth chamber 1 was exhausted for 20 seconds. By one cycle of such successive operations, a dimolecular layer of Si single crystal was grown on the substrate 8. As one practical example, when the same cycle was repeated 500 times under the same conditions, there was obtained a grown thin film of Si single crystal with a thickness of approximately 1360 Å on the (100) substrate.

Further, in order to grow a half-molecular layer of Si single crystal per cycle, the growth chamber 1 was evacuated to an ultrahigh vacuum and the surface of the substrate 8 was subjected to a heat cleaning. After heating the substrate 8 to 820° C., the valve 12 was opened to introduce $SiH_2Cl_2$ gas into the growth chamber 1 for 40 seconds while maintaining the pressure inside the growth chamber 1 at $1.3 \times 10^{-2}$ Pa. Thereafter, the valve 12 was closed and the gas inside the growth chamber 1 was exhausted for 20 seconds. By one cycle of such successive operations, a half-molecular layer of Si single crystal was grown on the substrate 8. In an exemplary crystal growing process, when the same operations were repeated 500 times under the same conditions, there was obtained a grown Si single crystal thin film with a thickness of approximately 340 Å on the (100) substrate.

As set forth above, according to the present invention, it is possible to grow single crystals of from one monolayer to several monolayers in thickness with a precision of monomolecular layer by appropriately varying the temperature of the substrate under the same gas feeding pressure.

Figure 3:
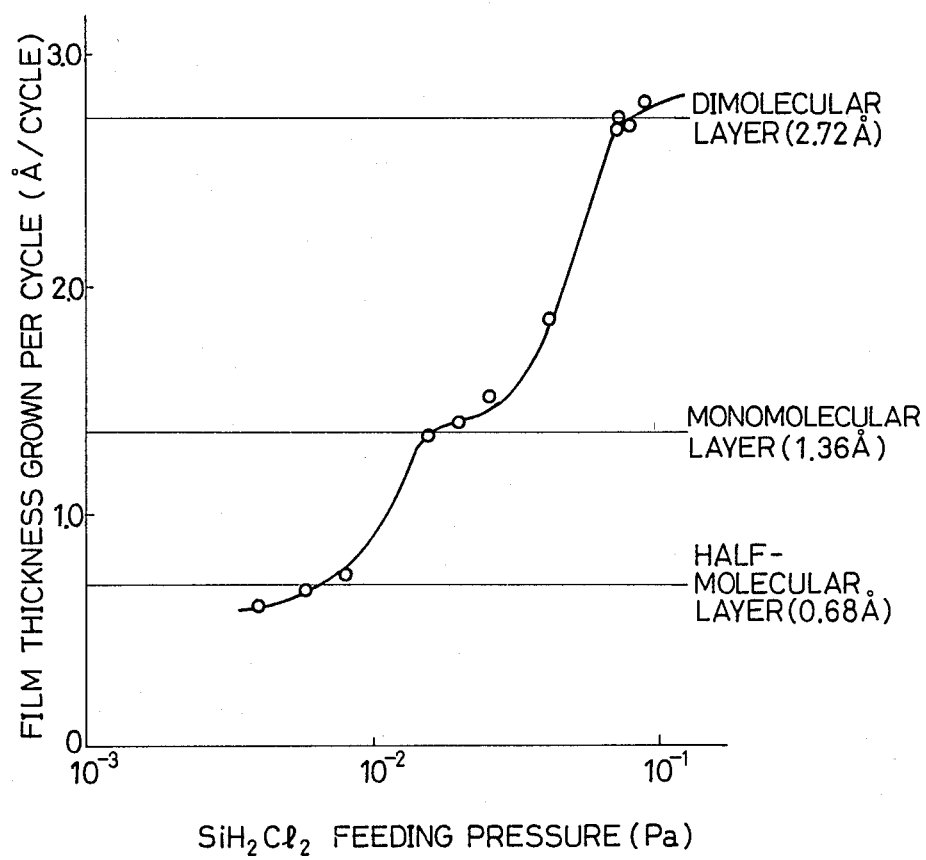
FIG. 3 is a graph showing the dependence of the film thickness grown per cycle of gas feeding and exhausting upon the gas feeding pressure.

FIG. 3 is a graph showing the dependence of the film thickness grown per cycle upon the gas feeding pressure in which $SiH_2Cl_2$ gas was used and the gas feeding pressure was varied while keeping the temperature of the substrate constant. In each cycle, the gas feeding time and the exhausting time were 40 seconds and 20 seconds. Thus, 60 seconds was required for each cycle. As practical examples of growing element semiconductor single crystals with a precision of monomolecular layer at a substrate temperature of 850° C., we will specifically describe about the operating conditions which make it possible to grow thin films of the order of one monolayer, dimolecular layer and half-molecular layer in thickness per cycle.

Firstly, in order to grow a monomolecular layer of Si single crystal in each cycle, the gate valve 2 was opened and the growth chamber was evacuated to the degree of vacuum where the interior pressure of the growth chamber 1 was about $10^{-7}$ to $10^{-8}$ Pa, using the ultrahigh vacuum exhaust 3. The substrate 8 was heated to 800° C. by the heater 5 or the infrared lamp 6 and the surface of the substrate 8 was subjected to heat cleaning for about 5 minutes. Then, the substrate 8 was heated to 850° C. by the heater 5 or the infrared lamp 6 and the valve 12 was opened to introduce $SiH_2Cl_2$ gas into the growth chamber 1 for 40 seconds. Throughout the introduction of the gas, the pressure inside the growth chamber 1 was of $1.5 \times 10^{-2}$ Pa. Thereafter, the valve 12 was closed and the gas in the growth chamber 1 was exhausted for 20 seconds. In one cycle of such successive operations, a monomolecular layer of Si single crystal was grown on the substrate 8. These successive operations were repeated under the same conditions to grow successively monomolecular layers. Similarly, in order to grow a dimolecular layer of Si single crystal per cycle, $SiH_2Cl_2$ gas was fed into the growth chamber 1 for 40 seconds so that the pressure inside the growth chamber 1 was brought to $7.0 \times 10^{-2}$ Pa and then the growth chamber 1 was evacuated for 20 seconds. A dimolecular layer of Si single crystal was grown on the substrate 8 per cycle.

Further in order to grow a half-molecular layer of Si single crystal for each cycle, $SiH_2Cl_2$ gas was introduced into the growth chamber 1 for 40 seconds so that the pressure within the growth chamber 1 was brought to $6.0 \times 10^{-3}$ Pa and then the growth chamber 1 was evacuated for 20 seconds. In one cycle of these successive operations, there was obtained a grown single crystal thin film with a film thickness equivalent to the thickness of a half-molecular layer on the substrate 8.

The above examples were carried out at a substrate temperature of 850° C., but, also within the substrate temperature range of 750° to 900° C., it is possible to grow single crystals with a precision of the order of monomolecular layer, as in the same manner as described in the above examples, by appropriately selecting optimum conditions for gas feeding pressure and time and the evacuating time.

Figure 4A:
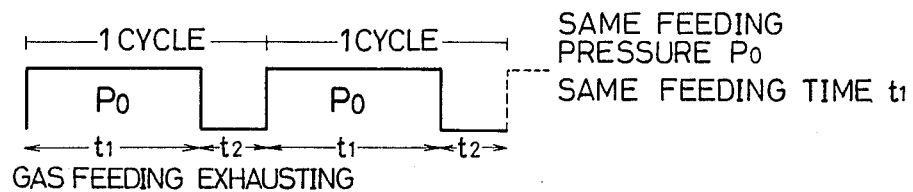
FIGS. 4(a) to 4(d) are sequence charts showing the pulses of gas feeding.
Figure 4B:
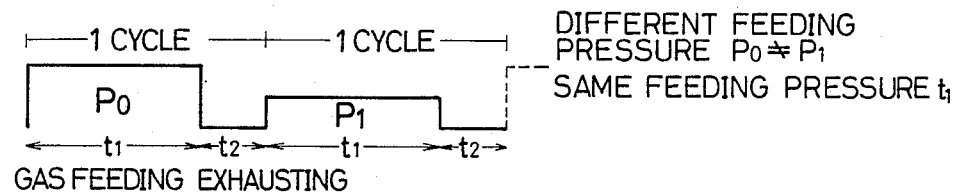
Figure 4C:
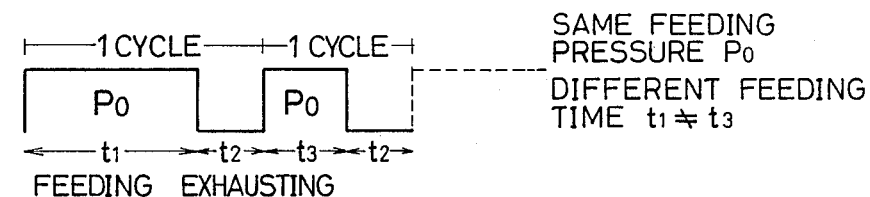
Figure 4D:
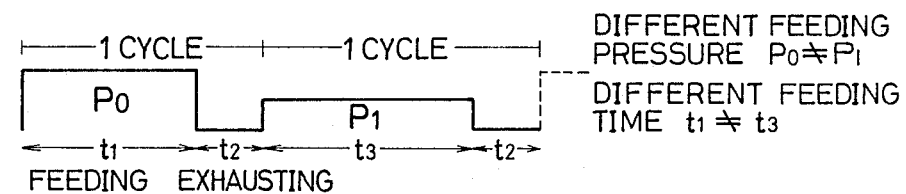

In the foregoing examples, the single crystal thin films having the desired thickness were grown by repeating the successive steps of gas feeding and evacuation under the same conditions throughout the growing process, as shown in a sequence chart in FIG. 4(a). However, it is not always required to conduct every cycle under the same conditions. If necessary, as shown in the sequence charts of FIGS. 4(b) to 4(d), gas feeding pressure and time may be changed. In FIGS. 4(a) to 4(d), feeding pressure and feeding time are indicated by $P_0$ and $P_1$ and $t_1$ and $t_3$, respectively, and exhaust time is indicated by $t_2$. In such cases, single crystals are grown to a film thickness of monolayers corresponding to the operating conditions of each cycle.

Further examples are illustrated in which element semiconductor single crystal thin films having a desired thickness are grown by continuously introducing a single kind of gas on the substrate 8 heated in the growth chamber 1 over a given period of time.

Figure 5:
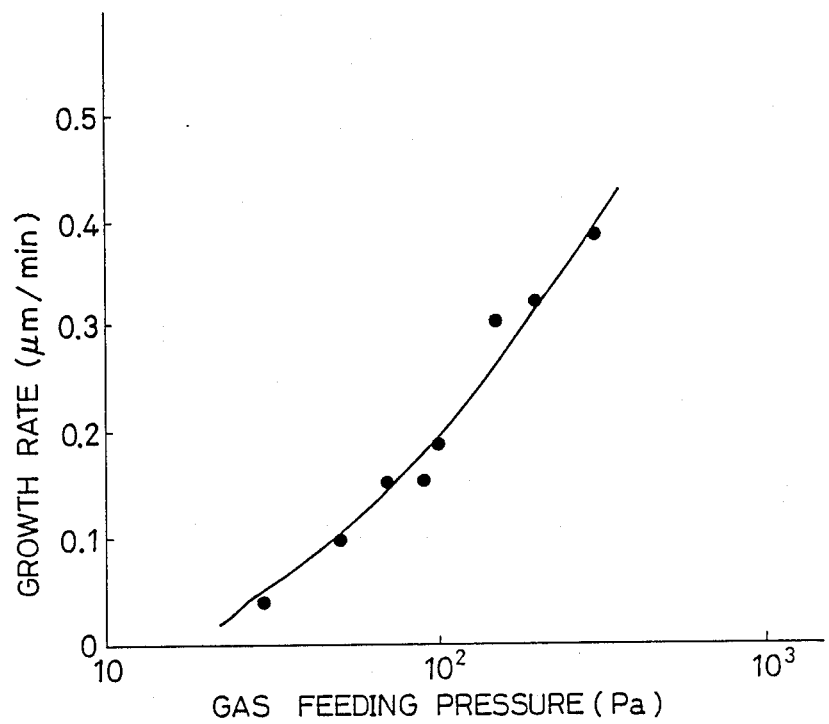
FIG. 5 is a graph showing the dependence of the growth rate upon the gas feeding pressure when gas is continuously fed for a given period of time.

FIG. 5 shows the dependence of growth rate of thin films upon the gas feeding pressure. The thin films were formed using $SiH_2Cl_2$ (dichlorosilane) as an Si-containing gas. The temperature of the substrate 8 was maintained constant and the gas feeding pressure was varied. As noted from FIG. 5, the growth rate ($\mu$m per minute) is increased on the order of 0.1 $\mu$m. For example, in order to form a grown thin film of 1 $\mu$m in thickness, the gate valve 2 was opened and the growth chamber 1 was evacuated to the degree where the pressure within the growth chamber 1 reached $10^{-6}$ Pa or less. The surface of the substrate 8 was subjected to heat cleaning and then the substrate 8 was heated to 1050° C. by the heater 5 or by the infrared lamp 6. The valve 12 was opened to introduce $SiH_2Cl_2$ gas into the growth chamber 1 for 10 minutes, while keeping the pressure inside the growth chamber 1 at 50 Pa. This procedure formed a 1 $\mu$m thick single crystal thin film onto the substrate 8.

As the ultrahigh vacuum exhaust in the foregoing examples, turbo-molecular pump, cryopump, ion pump or other known vacuum pumps can be employed. Further, in the above described examples, only Si single crystals are described. However, the present invention can also be applied to other IV-Group semiconductors, such as Ge. Further, the material of the substrate is not limited to Si. Other materials, such as sapphire or spinel, can also be employed.

As described above, according to the present invention, it is possible to grow element semiconductor single crystal thin films on a substrate with the precision of monomolecular layer using only a single kind of gas containing a component element of an element semiconductor. Since only such a single gas is used as a source gas, there can be readily obtained single crystal thin films of high quality in a high reproducibility, by simplified operating parameters, without causing contamination problems by impurities (e.g., oxygen, carbon, etc.), which are associated with the use of carrier gas such as hydrogen. Further, the single crystal growth of the present invention is advantageous in that the operating temperature for single crystal growth is approximately 250° C. lower than usual epitaxial temperature (approximately 1100° C.). In addition, the present invention has an industrial merit that the growing apparatus can be also simplified, since a gas feeding line is simplified.

What is claimed is:

1. A method for growing a single crystal thin film of silicon, said method comprising:

heating a substrate to a temperature of 750° to 900° C., repeating the successive steps of feeding a single kind of gas selected from the group consisting of $SiH_2Cl_2$, $SiHCl_3$ and $SiCl_4$ onto said substrate in a growth chamber at a pressure of $10^{-4}$ to $10^2$ Pa for from 1 to 60 seconds and then exhausting said gas in the growth chamber for from 1 to 120 seconds and thereby growing a thin layer having a thickness on the order of from one to several monomolecular layers during each cycle of said feeding and exhausting steps, and continuing said successive steps until a single crystal thin film made of the desired number of said thin layers is obtained.

2. A method for growing a single crystal thin film of silicon by the molecular layer epitaxy crystal-growth method, which consists essentially of: cyclically performing alternating steps of 1. feeding a single stream of gas selected from the group consisting of $SiH_2Cl_2$, $SiHCl_3$ and $SiCl_4$, for from 1 to 60 seconds, onto a substrate heated to a temperature of from 750° to 900° C. and located in a crystal growth chamber having an internal pressure of from $10^{-4}$ to $10^2$ Pa, and then 2. discontinuing feeding of said single stream of gas and exhausting said gas in said growth chamber for from 1 to 20 seconds, so that in each cycle of steps (1) and (2) there is formed a thin layer having a thickness of from about a one-half molecular layer to about a dimolecular layer whereby to grow a single crystal thin film of silicon of a desired thickness on said substrate, the same gas being used in each repetition of step (1).

* * * * *